United States Patent [19]
Evans

[11] Patent Number: 5,552,784
[45] Date of Patent: Sep. 3, 1996

[54] DISTORTION REDUCTION CIRCUIT FOR ANALOG TO DIGITAL CONVERTER SYSTEM

[75] Inventor: William P. Evans, Catonsville, Md.

[73] Assignee: Northrop Grumman Corporation, Los Angeles, Calif.

[21] Appl. No.: 268,366

[22] Filed: Jun. 30, 1994

[51] Int. Cl.$^6$ ........................................... H03M 1/14
[52] U.S. Cl. ............................ 341/122; 341/156; 327/96
[58] Field of Search ................................ 341/122, 156; 327/91–96

[56] References Cited

U.S. PATENT DOCUMENTS

| | | |
|---|---|---|
| 4,814,722 | 3/1989 | Hartmann et al. . |
| 4,862,171 | 8/1989 | Evans ........................ 341/156 |
| 4,885,545 | 12/1989 | Sanielevici . |
| 4,894,656 | 1/1990 | Hwang et al. ................ 341/120 |
| 4,896,155 | 1/1990 | Craiglow ....................... 341/120 |
| 5,099,240 | 3/1992 | Nakatani et al. .............. 341/156 |
| 5,243,235 | 9/1993 | Wakayama et al. . |
| 5,248,973 | 9/1993 | Babu et al. .................... 341/156 |

Primary Examiner—Howard L. Williams

[57] ABSTRACT

An analog to digital (A/D) converter apparatus is disclosed which increases spurious free dynamic range without adding a significant amount of noise. The apparatus includes a sample and hold circuit, a main range A/D converter for converting the sample and hold circuit output into a first digital signal, and a digital to analog (D/A) converter for converting the output of the main range A/D converter to an analog signal which is fed to a summing node. The output of the sample and hold circuit is also fed to the summing node through a first load resistor. The difference between the D/A output and the sample and hold output is generated at the summing node, and this difference is amplified and digitized by a subrange A/D converter. Added circuitry including a bootstrap amplifier and second load resistor are provided to increase the load impedance on the sample and hold output. An embodiment making use of multiple sample and hold circuits connected in parallel using a bootstrap amplifier is also disclosed.

18 Claims, 2 Drawing Sheets

DISTORTION REDUCTION CIRCUIT FOR ANALOG TO DIGITAL CONVERTER SYSTEM

BACKGROUND OF THE INVENTION

1. Field of the Invention

This invention relates generally to analog to digital converters. More particularly, this invention relates to high speed analog to digital converters that will produce accurate and reliable results over wide ranges of temperature and other conditions with a minimum of distortion.

2. Description of Related Art

High speed analog to digital converters have been proposed which use "flash" converter integrated circuits. Such "flash" circuits include a plurality of voltage comparators that compare the level of an analog input voltage with a series of reference voltage levels supplied in steps of uniform magnitude, typically by a string of resistors that are connected to a reference voltage source. The magnitude of the input analog signal is indicated by the number of comparator output signals produced, i.e., by the number of reference voltage levels that are exceeded by the input voltage. A "thermometer" code output is thus produced, which is converted to binary by a decoder circuit.

Because such flash converter circuits require a large number of comparators and associated voltage levels to obtain high resolution, subranging A/D architectures have been proposed, using both a main range A/D converter and a second or "subrange" A/D converter. In proposed subranging architectures, an input signal is first sampled by a sample and hold circuit. The output of the sample and hold circuit is fed to a main range A/D converter, which is of the flash type and has a limited number of comparators, e.g., 32 or 64. The main A/D converter produces a binary coded output which is a first approximation of the magnitude of an input analog signal. The first approximation so produced is then converted to an analog signal by a high speed precision digital to analog converter (D/A). The analog signal developed at the output of the D/A is then subtracted from the analog input signal at a summing node, and fed to a subrange amplifier which amplifies the result to a level where it can be digitized by the subrange A/D converter. The output of the subrange amplifier is then applied to the subrange A/D converter to produce a binary coded output. The binary coded output of the subrange A/D converter is logically combined with the binary coded output from the main range A/D converter to produce the final binary coded digital output.

In the proposed subranging A/D architecture, the sample and hold circuit drives a load resistor connected between the sample and hold circuit and the summing node. In order to minimize noise and increase speed, the resistance value of this resistor must be kept relatively low. Unfortunately, as the resistance of the load resistor is decreased, the output impedance seen by the output buffer of the sample and hold circuit driving the resistor decreases, generating distortion. Although a digital calibration could be used to reduce this distortion in some applications, such an approach would add considerable complexity to the A/D circuit and require additional testing time to determine the proper digital correction values. Therefore, there is a need for an A/D converter that reduces the distortion caused by loading the output buffer of the sample and hold circuit without significantly increasing the circuit complexity and added noise.

SUMMARY OF THE INVENTION

Accordingly, the present invention is directed to an improved analog to digital converter circuit that substantially obviates one or more of the limitations and disadvantages of the related art.

To achieve these and other objects and advantages and in accordance with the purpose of the invention, as embodied and broadly described herein, the invention comprises means for sampling an input analog signal to form a first analog signal on an output line, a first A/D converter, connected to the output line of the sampling means, for obtaining at an output a first digital signal from the first analog signal, a digital to analog converter, connected to the output of the first A/D converter, for converting the first digital signal obtained by the first A/D converter into a second analog signal, a summer, connected to the output line of the sampling means and the output of the digital to analog converter, for obtaining a third analog signal equal to the difference between the first analog signal and the second analog signal, a second A/D converter for converting the third analog signal into a second digital signal, and output logic for combining the first digital signal and the second digital signal to form a third digital signal, a first amplifier, connected between the sampling means and the summer, for amplifying the first analog signal, and a first load resistor, connected between the output of the sampling means and the summer.

In another aspect, the invention comprises a first sampling means for sampling an input analog signal to form a first analog signal on an output line, a second sampling means for sampling the input analog signal to form a second analog signal on an output line, a first A/D converter, connected to the output lines of the first and second sampling means, for obtaining a first digital signal from the first analog signal and the second analog signal, a digital to analog converter, connected to the output of the first A/D converter, for converting the first digital signal obtained by the first A/D converter into a third analog signal, a summing node, connected to the output line of the first sampling means, the output line of the second sampling means, and an output of the digital to analog converter, for obtaining a fourth analog signal equal to the difference between the first and second analog signals and the third analog signal, a second A/D converter for converting the fourth analog signal into a second digital signal, output logic for combining the first digital signal and the second digital signal to form a third digital signal, a first amplifier, connected between the first sampling means and the summing node, for amplifying the first analog signal, a first load resistor connected between the first sampling means and the summing node, a second load resistor connected between the first load resistor and the first amplifier, a third load resistor connected between the second sampling means and the summing node, and a fourth load resistor connected between the first amplifier and the third load resistor.

It is to be understood that both the foregoing general description and the following detailed description are exemplary and explanatory and are intended to provide further explanation of the invention as claimed.

The accompanying drawings, which are incorporated in and constitute a part of this specification, illustrate an embodiment of the invention and together with the description serve to explain the principles of the invention.

DESCRIPTION OF THE PREFERRED EMBODIMENTS

Reference will now be made in detail to the present preferred embodiments of the invention, examples of which are illustrated in the accompanying drawings.

Figure 1:
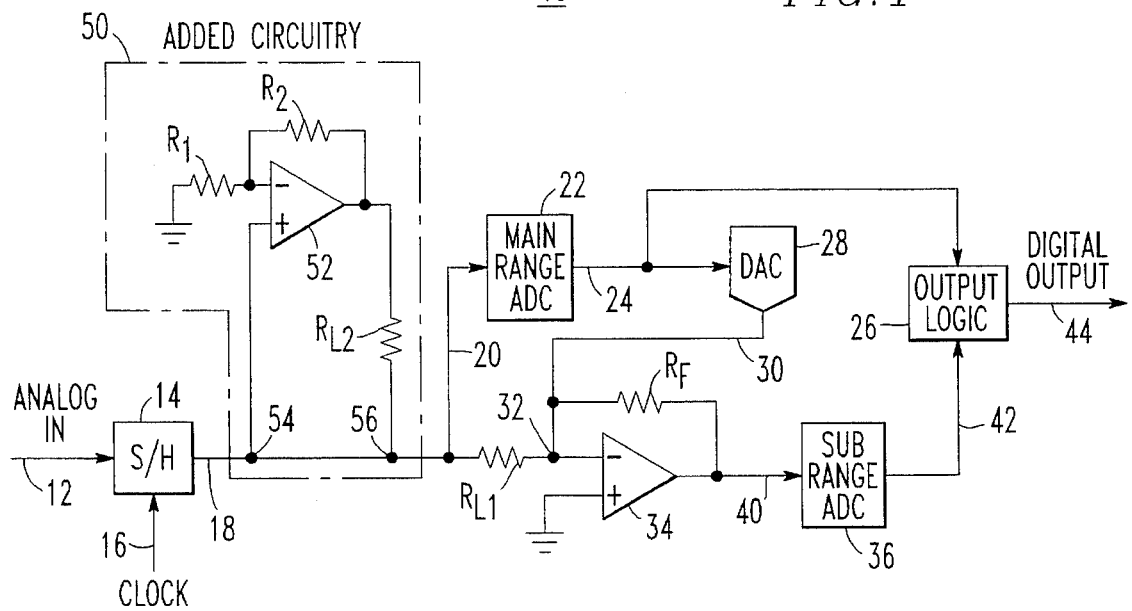
FIG. 1 is a schematic diagram of an analog to digital converter apparatus constructed in accordance with a first embodiment of the invention.

The first embodiment of the analog to digital converter apparatus of the present invention is shown in FIG. 1 and is designated generally by reference numeral 10. The A/D converter apparatus 10 has a subranging architecture, and includes a sample and hold circuit 14, a main range A/D converter 22, a subrange A/D converter 36, a digital to analog converter (DAC) 28, and output logic 26. A/D converter apparatus 10 also includes a summing node 32, a subrange amplifier 34, a first load resistor $R_{L1}$, and a subrange amplifier feedback resistor $R_f$. A/D converter apparatus 10 further includes added circuitry for reducing distortion, including amplifier 52, a second load resistor $R_{L2}$, and resistors $R_1$ and $R_2$.

The analog to digital converter apparatus 10 includes means for sampling an input analog signal to form at an output a first analog signal, shown in FIG. 1 by sample and hold circuit 14. Sample and hold circuit 14 receives an analog input signal 12. Sample and hold circuit 14 also receives a clock signal 16, which controls the sampling rate. The first analog signal is output from sample and hold circuit 14 on line 18. Sample and hold circuit 14 drives a first load resistor $R_{L1}$, connected to the output of sample and hold circuit 14.

A/D converter apparatus 10 also includes a first analog to digital converter, connected to the sampling means, for obtaining at an output a first digital signal from the first analog signal. The first analog to digital converter is shown in FIG. 1 by main range A/D converter 22, which outputs the first digital signal on line 24. The output of sample and hold circuit 14 on line 18 is fed to main range A/D converter 22 on line 20. Main range A/D converter 22 develops binary coded signals corresponding to a first approximation of the input and defining the more significant bits of the final output. For example, when a 10 bit final output is to be provided from the apparatus 10, the main range A/D converter 22 may supply the 5 most significant bits of the final output. Main range A/D converter 22 may be a "flash" type converter, including a plurality of voltage comparators that compare the input signal with a series of reference voltage levels supplied in steps of uniform magnitude by a string of resistors connected to a reference voltage source. The output of these comparators is fed to a decoder circuit to convert the output into a binary coded output. A plurality of buffers for holding the binary coded output may also be provided. It should be recognized, however, that the present invention is not limited to any particular construction of the converter 22. A more detailed description of a main range A/D converter is provided in U.S. Pat. No. 4,862,171 to Evans, which is hereby incorporated by reference.

Apparatus 10 further includes a digital to analog converter 28, connected to the output of the first A/D converter 22, for converting the first digital signal obtained by the first A/D converter into a second analog signal. The first digital signal on the output 24 of main range A/D converter 22 is fed to digital to analog converter 28. D/A converter 28 converts the digital output of main range A/D converter 22 into the second analog signal, which is output on line 30.

Apparatus 10 further includes a summing node, connected to the output of the sampling means and the output of the digital to analog converter, for obtaining a third analog signal equal to the difference between the first analog signal and the second analog signal. This summing node is designated by reference numeral 32 in FIG. 1. Summing node 32 receives the first output signal from sample and hold circuit 14 fed through load resistor $R_{L1}$, and receives the second analog signal from the output of D/A converter 22 on line 30. The voltage generated by the sample and hold circuit 14 generates a current through load resistor $R_{L1}$ equal to $V_{S/H}/R_{L1}$, which flows into summing node 32. The current out of the digital to analog converter 28 is an approximation of the voltage fed to the main range analog to digital converter 22, but with the opposite polarity. Summing node 32 develops the third analog signal equal to the difference in current between the first analog signal (the current through load resistor $R_{L1}$), and the second analog signal (the current from the output of D/A converter 28).

The embodiment of FIG. 1 further includes an amplifier, connected between the summing node and the second A/D converter, for amplifying the third analog signal. This amplifier is shown in FIG. 1 by subrange operational amplifier 34, which is connected to be in an inverting configuration. The noninverting input of subrange amplifier 34 is connected to ground. Feedback resistor $R_f$ is connected between the output and the inverting input of subrange amplifier 34. The inverting input of subrange amplifier 34 receives the third analog signal corresponding to the difference of the currents flowing into the summing node 32, and routes this signal through the feedback resistor $R_f$. The subrange amplifier 34 amplifies the signal at summing node 32 to match the input voltage range of the subrange A/D converter 36. The resistance of feedback resistor $R_f$ can be adjusted to set the voltage gain of the amplifier 34 so that the voltage at the amplifier output matches the range required by subrange A/D converter 36. As an example, $R_f$ may have a resistance value of 2000 ohms. Amplifier 34 also acts to isolate summing node 32 from the high capacitance of the input of subrange A/D converter 36.

Apparatus 10 also includes a second A/D converter for converting the amplified third analog signal from the amplifier 34 into a second digital signal. This second A/D converter is shown in FIG. 1 by subrange A/D converter 36, which receives as an input the amplified third analog signal on line 40 from subrange amplifier 34. Subrange A/D converter 36 outputs on line 42 a second digital signal, which is a binary coded digital signal, corresponding to the third analog signal input on line 40. This binary coded digital signal corresponds to the less significant bits of the final output of the apparatus 10. For example, when a 10 bit final output is to be provided from the apparatus 10, the subrange A/D converter 36 may supply the 5 least most significant bits of the final output. The subrange A/D converter may supply more than 5 bits in order to provide some overlap with main range A/D converter 22. The output of subrange A/D converter 36 on line 42 is fed to output logic 26. Subrange A/D converter 36 may be a "flash" type converter similar in construction to main range A/D converter 22. It should be recognized, however, that the present invention is not limited to any particular construction of subrange A/D converter 36.

Apparatus 10 additionally includes output logic 26 for combining the first digital signal and the second digital signal to form a third digital signal. Output logic 26 combines the first digital binary coded signal from main range A/D converter 22 with the second digital binary coded signal from subrange A/D converter 36 to form a third digital binary coded output signal on line 44.

The preferred embodiment of the invention includes added circuitry 50 connected between the output of sample and hold circuit 14 and first load resistor $R_{L1}$. Added circuitry 50 acts to reduce the distortion caused by loading of the output of sample and hold circuit 14.

Added circuitry 50 includes an amplifier, connected between the sampling means and the first load resistor, for amplifying the first analog signal. This amplifier is shown in FIG. 1 by operational amplifier 52, which is connected in a non-inverting configuration. The noninverting input of amplifier 52 is connected to the output of sample and hold circuit 14 at node 54. Resistor $R_1$ is connected between the inverting input of amplifier 52 and ground, and resistor $R_2$ is connected between the input and the output of amplifier 52. Because amplifier 52 is in the non-inverting configuration, it has a voltage gain equal to $1+R_2/R_1$. Amplifier 52 amplifies the signal at node 54, and provides the output back to the sample and hold output on line 18. Amplifier 52 preferably amplifies the signal at node 54 by a factor of two, which will be realized if $R_1=R_2$, although other amplification factors may be used as well. Amplifier 52 also must have a fast settling time so as not to appreciably slow the response speed at node 56. For purposes of illustration, $R_1$ and $R_2$ may have resistance values of 250 ohms, although other values may be used as well.

Circuitry 50 also includes a load resistor connected between the output of the amplifier 52 and the first load resistor. The amplified signal output by amplifier 52 is provided back to the sample and hold output on line 18 at node 56 through resistor $R_{L2}$. The resistance of resistor $R_{L2}$ is preferably equal to the resistance of load resistor $R_{L1}$. As an example, $R_{L1}$ and $R_{L2}$ may have a resistance value of 125 ohms.

Using the configuration shown in FIG. 1, amplifier 52 provides virtually all the current to resistor $R_{L1}$ previously supplied by sample and hold circuit 14, reducing the output buffer distortion previously created by the output buffer of sample and hold 14. Because operational amplifier 52 greatly reduces the current supplied by the sample and hold circuit, it is referred to as a "bootstrap" amplifier.

Figure 2:
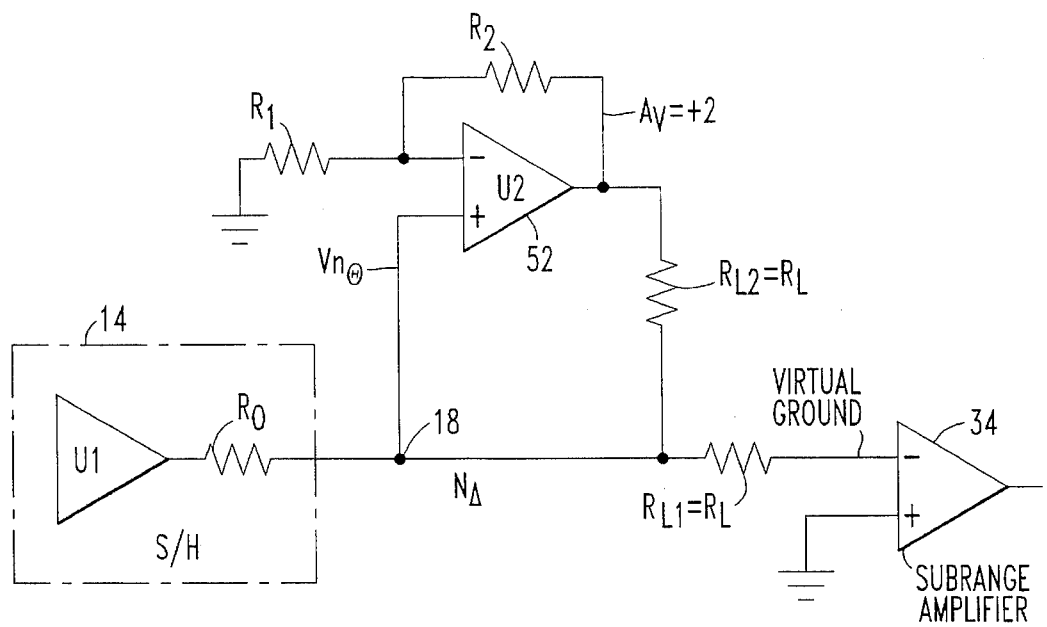
FIG. 2 is a schematic diagram of a portion of the analog to digital converter apparatus of FIG. 1 used to describe the derivation of the added noise component.

The noise contribution of the added amplifier 52 will be described below with reference to FIG. 2. FIG. 2 shows a portion of analog to digital converter apparatus 10 illustrated in FIG. 1. In FIG. 2, sample and hold circuit 14 includes output buffer U1 and output impedance $R_o$. Op amp 52 is designated U2, and $V_n$ indicates the equivalent input noise of amplifier U2. The impedance of $R_o$ is much less than the resistance of $R_L$, and the resistance of $R_{L1}$ and $R_{L2}$ is equal to $R_L$. The noise added to the sample and hold output by op amp 52 is designated by $N_\Delta$. Because amplifier U2 has a gain of 2, the noise at its output is given by:

$$U2 = 2V_n + 2N_\Delta.$$

The added noise is then given by:

$$N_\Delta = (2V_n + 2N_\Delta) \frac{(R_L \| R_o)}{(R_L + R_L \| R_o)}$$

If $R_o \ll R_L$, then:

$$N_\Delta \approx \frac{2V_n R_o}{R_L} \quad \frac{(1)}{(1 - 2R_o/R_L)} \approx \frac{2V_n R_o}{R_L}$$

This added noise is small if $R_o \ll R_L$. Typical values for $R_L$ and $R_o$ could be 125 ohms and 5 ohms, respectively.

The distortion created by the output buffer in sample and hold circuit 14 is primarily due to the nonlinear nature of the buffer output impedance $R_o$. Thus, if the load impedance can be kept large, the effect of $R_o$ on the output impedance is decreased and output buffer distortion can be minimized.

Figure 3:
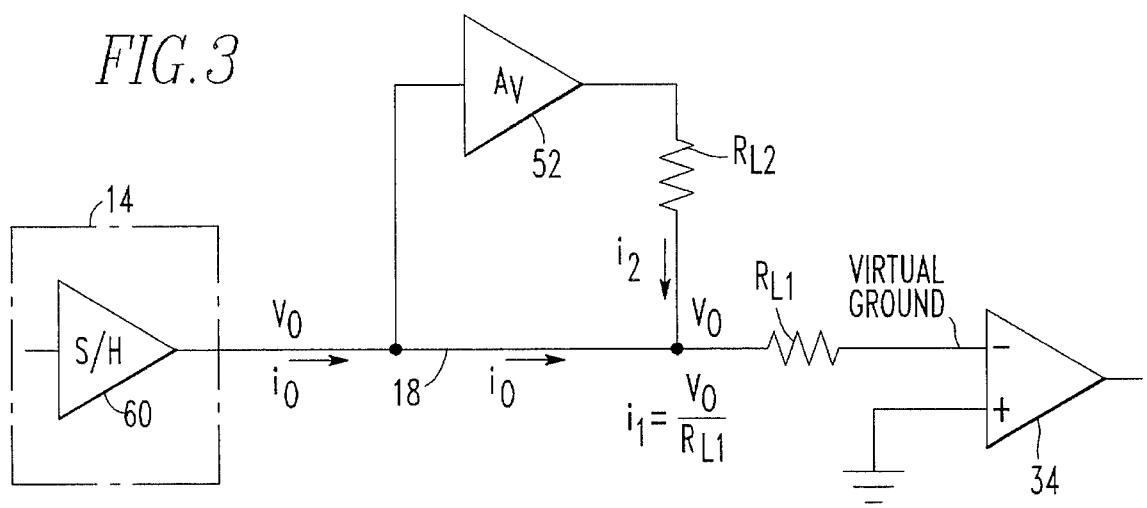
FIG. 3 is a schematic diagram of a portion of the analog to digital converter apparatus of FIG. 1 used to describe the derivation of load impedance of the sample and hold output.

The load impedance seen by the sample and hold circuit 14 will be described below with reference to FIG. 3, which shows a portion of analog to digital converter apparatus 10 illustrated in FIG. 1. In FIG. 3, the gain of amplifier 52 is shown as $A_v$. Voltages $V_o$ and currents $i_o$, $i_1$, and $i_2$ are shown in various parts of the circuit. The output buffer of sample and hold circuit 14 is shown by reference numeral 60.

In the circuit of FIG. 3, the load impedance of output buffer 60 is defined as:

$$R_{Load} = V_o / i_o$$

Since $i_o = i_1 - i_2$, $i_o$ can be expressed as:

$$i_o = \frac{V_o}{R_{L1}} - \frac{A_v V_o - V_o}{R_{L2}} = \left[ \frac{1}{R_{L1}} - \frac{A_v}{R_{L2}} + \frac{1}{R_{L2}} \right] V_o$$

$V_o/i_o$ can be expressed as:

$$\frac{V_o}{i_o} = \frac{1}{(1/R_{L1} + 1/R_{L2} - A_v/R_{L2})} = \frac{R_{L1} R_{L2}}{(R_{L2} + R_{L1} - A_v R_{L1})}$$

Thus, $R_{Load}$ can be expressed as:

$$R_{Load} = \frac{R_{L1} R_{L2}}{R_{L1} + R_{L2} - A_v R_{L1}}$$

As a result, $R_{Load}$ equals infinity if $R_{L1}=R_{L2}$ and $A_v=2$. Thus, the output impedance seen by sample and hold buffer 60 approaches infinity, and the distortion caused by $R_o$ is minimized.

Figure 4:
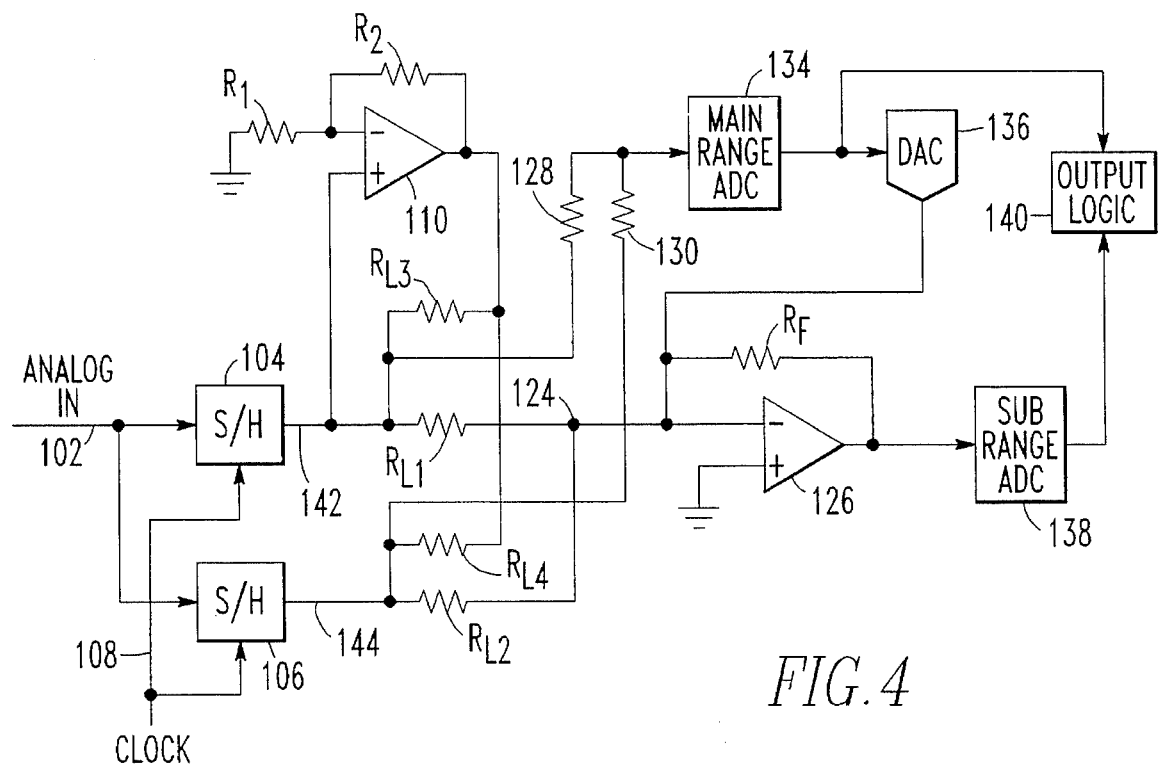
FIG. 4 is a schematic diagram of an analog to digital converter apparatus using parallel sample and hold circuits in accordance with a second embodiment of the invention.

FIG. 4 illustrates second embodiment of an analog to digital converter apparatus 100 of the present invention. Analog to digital converter apparatus 100 has two sample and hold circuits 104 and 106 connected in parallel, using a bootstrap operational amplifier 110. The use of the two parallel sample and hold circuits allow the sample and hold noise to be reduced by 3 dB. Each one of sample and holds 104 and 106 supplies one half of the required current to the summing node 124 of the subrange amplifier 126 on lines 142 and 144 and load resistors $R_{L1}$ and $R_{L2}$. Load resistors $R_{L1}$ and $R_{L2}$ preferably have equal resistances.

In FIG. 4, sample and hold circuit 104 samples the analog input signal 102 and receives a clock input 108. The output of sample and hold circuit 104 is fed to the input of main range analog to digital converter 134 through resistor 128. Main range A/D 134 also receives the output of sample and hold circuit 106 through resistor 130. Resistors 128 act to present the main range A/D with the average of the voltage on lines 142 and 144. Although ideally the voltages on lines 142 and 144 should be identical, in reality, they will be slightly different due to factors such as different sample and hold offset voltages, different aperture delays, etc.

The digitized output of main range A/D 134 is fed to digital to analog converter 136 which converts the digital signal into an analog signal and outputs it to summing node 124. The output of main range A/D 134 is also fed to output logic 140.

The output of sample and hold circuit 104 is fed on line 142 to summing node 124 through load resistor $R_{L1}$, and is also fed to the noninverting input of operational amplifier 110. Amplifier 110 is connected in a non-inverting configuration with a voltage gain of $1+R_2/R_1$. Amplifier 110 preferably has a gain of two, which is realized by setting $R_1=R_2$. $R_1$ and $R_2$ may have resistance values of approximately 250 ohms. The output signal from amplifier 110 is fed through load resistor $R_{L3}$ back to line 142 to bolster the current of the signal on line 142. This bolstered signal is then fed to summing node 124 through load resistor $R_{L1}$. Load resistors $R_{L3}$ and $R_{L1}$ preferably have equal resistance values.

The output of sample and hold circuit 106 is provided on line 144 and fed to main range A/D converter through resistor 130. The output signal from amplifier 110 is fed through load resistor $R_{L4}$ back to line 144 to bolster the current of the signal on line 144. This bolstered signal is then fed to summing node 124 through load resistor $R_{L2}$. Load resistors $R_{L2}$ and $R_{L4}$ preferably have equal resistance values. $R_{L1}$, $R_{L2}$, $R_{L3}$, and $R_{L4}$ may have resistance values of 250 ohms, for example. Each of sample and hold circuits 104 and 106 supply half of the required current to the summing node 124.

Summing node 124 is connected to the inverting input of subrange amplifier 126, and is thus a virtual ground. Subrange amplifier 126 is connected in an inverting configuration. The sum of the currents from the digital to analog converter 136, from the resistor $R_{L1}$, and from the resistor $R_{L2}$ are forced through resistor $R_f$ by subrange amplifier 126. Resistor $R_f$ may have a resistance value of approximately 2000 ohms. The voltage at the output of the subrange amplifier 126 is therefore $-R_f(I_{DAC}+I_{RL1}+I_{RL2})$. This voltage is fed to subrange A/D converter 138, which forms a digital signal based on the output of amplifier 126. The output of subrange A/D 138 is fed to output logic 140, where it is combined with the output of main range A/D 134 to form the final binary coded output signal.

The main range and subrange analog to digital circuits, as well as the digital to analog converter and output logic in apparatus 100 may be identical to those of FIG. 1, and thus need not be further described with regard to the circuit of FIG. 4.

Using the configuration shown in FIG. 4, amplifier 110 provides virtually all the current to resistors $R_{L1}$ and $R_{L2}$ previously supplied by sample and hold circuits 104 and 106. As a result, the output buffer distortion previously created by the output buffers of sample and hold circuits 104 and 106 is reduced.

The use of the bootstrap amplifier 110 in many instances increases the spurious free dynamic range of the A/D apparatus 100 by over 16 dB as compared to a parallel S/H configuration without the bootstrap amplifier 110. The technique of using parallel sample and hold circuits discussed above in regard to FIG. 4 can be extended to any number of parallel sample and hold circuits in order to further reduce sample and hold noise.

It will be apparent to those skilled in the art that various modifications and variations can be made in the analog to digital converter apparatus of the present invention without departing from the spirit or scope of the invention. Thus, it is intended that the present invention cover the modifications and variations of this invention provided they come within the scope of the appended claims and their equivalents.

What is claimed is:

1. An analog to digital converter apparatus, comprising:
   means for sampling an input analog signal to form a first analog signal on an output line;
   a first A/D converter, connected to the output line of the sampling means, for obtaining at an output a first digital signal from the first analog signal;
   a digital to analog converter, connected to the output of the first A/D converter, for converting the first digital signal obtained by the first A/D converter into a second analog signal;
   a second A/D converter for converting the difference between the first analog signal and the second analog signal into a second digital signal;
   output logic for combining the first digital signal and the second digital signal to form a third digital signal;
   a first load resistor, connected to the output of the sampling means;
   a first amplifier, connected to the output of the sampling means and the first load resistor, for amplifying the first analog signal;
   a second load resistor, connected between the output of the first amplifier and the first load resistor.

2. The apparatus of claim 1, wherein the first amplifier and the second load resistor are provided in parallel with at least a portion of the output line of the sampling means.

3. The apparatus of claim 1, wherein the first A/D converter is a main range A/D converter for obtaining a digital approximation of the first analog signal.

4. The apparatus of claim 3, further comprising a summing node, connected to the first load resistor and the output of the digital to analog converter, for obtaining a third analog signal equal to a difference between the first analog signal and the second analog signal.

5. The apparatus of claim 4, further comprising:
   a second amplifier, having an inverting input connected to the summing node and an output connected to the input of the second A/D converter, for amplifying the third analog signal.

6. The apparatus of claim 5, wherein the second A/D converter is a subrange A/D converter for obtaining a digital approximation of the third analog signal.

7. The apparatus of claim 5, wherein the second amplifier is connected in an inverting configuration.

8. The apparatus of claim 1, wherein the sampling means is a sample and hold circuit.

9. The apparatus of claim 1, wherein the first amplifier is connected in a non-inverting configuration.

10. The apparatus of claim 1, wherein the resistance of the first load resistor is approximately equal to the resistance of the second load resistor.

11. An analog to digital converter apparatus, comprising:
    a first sampling means for sampling an input analog signal to form a first analog signal on an output line;
    a second sampling means for sampling the input analog signal to form a second analog signal on an output line;
    a first A/D converter, connected to the output lines of the first and second sampling means, for obtaining a first digital signal from the first analog signal and the second analog signal;

a digital to analog converter, connected to the output of the first A/D converter, for converting the first digital signal obtained by the first A/D converter into a third analog signal;

a first load resistor having a first end connected to the output line of the first sampling means;

a second load resistor having a first end connected to the output line of the second sampling means;

a summing node, connected to a second end of the first load resistor, a second end of the second load resistor, and an output of the digital to analog converter, for obtaining a fourth analog signal equal to the difference between the first and second analog signals and the third analog signal;

a second A/D converter for converting the fourth analog signal into a second digital signal;

output logic for combining the first digital signal and the second digital signal to form a third digital signal;

a first amplifier, having an input connected to the output line of the first sampling means, for amplifying the first analog signal;

a third load resistor connected between the first load resistor and an output of the first amplifier; and a fourth load resistor connected between the second load resistor and the output of the first amplifier.

12. The apparatus of claim 11, wherein the first amplifier and the third load resistor are provided in parallel with at least a portion of the output line of the first sampling means.

13. The apparatus of claim 12, wherein the second A/D converter is a subrange A/D converter.

14. The apparatus of claim 13, further comprising:

a subrange amplifier, connected between the summing node and the subrange A/D converter, for amplifying the fourth analog signal.

15. The apparatus of claim 14, wherein the subrange amplifier is connected in an inverting configuration.

16. The apparatus of claim 11, wherein the first A/D converter is a main range A/D converter.

17. The apparatus of claim 11, wherein the resistances of the first, second, third, and fourth load resistors are approximately equal.

18. The apparatus of claim 11, wherein the first amplifier is connected in a non-inverting configuration.

* * * * *